March 14, 1967

A. H. B. WALKER 3,309,527

CHOPPER AMPLIFIER

Filed Feb. 21, 1963

WITNESSES
Leon J. Laga
James L. Young

INVENTOR
Alec H. B. Walker
BY
Francis E. Blake
ATTORNEY

United States Patent Office 3,309,527
Patented Mar. 14, 1967

3,309,527

CHOPPER AMPLIFIER

Alec H. B. Walker, Trafford, Pa., assignor to Westinghouse Electric Corporation, Pittsburgh, Pa., a corporation of Pennsylvania Filed Feb. 21, 1963, Ser. No. 260,198
16 Claims. (Cl. 307—88.5)

Figure 1:
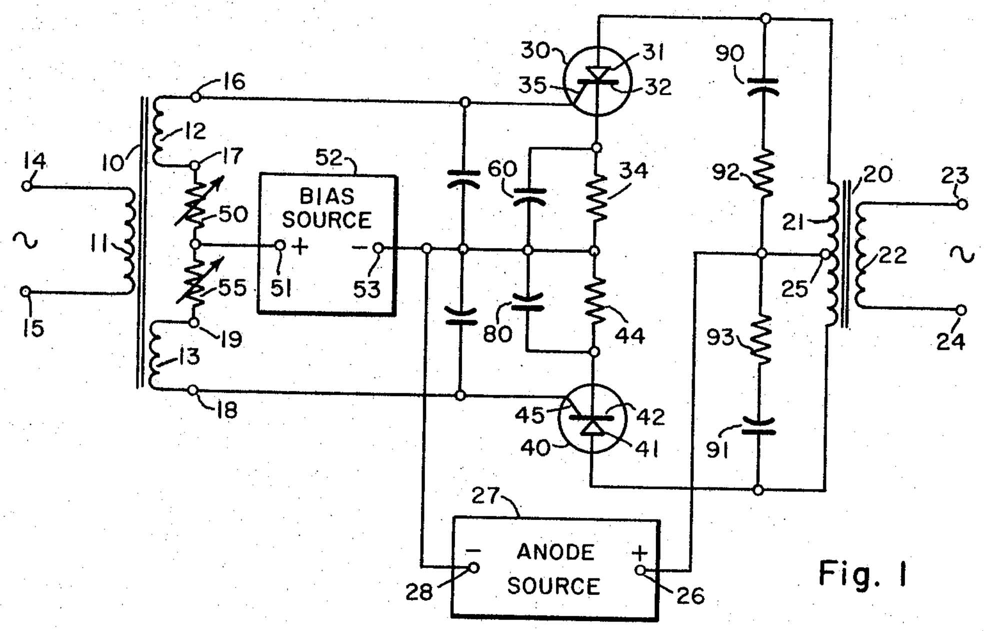

The present invention relates to power amplifiers and to such power amplifiers that are particularly suitable for amplificaions of signals in the audio frequency range.

The so-called chopper type of power amplifier is a well-known circuit arrangement for obtaining relatively high power amplification of signals which may be in the audio frequency range, for example, in utilizations where moderate amounts of distortion of the signal to be amplified may be unimportant and can be tolerated. In Patent No. 3,210,563, issued Oct. 5, 1965, in the name of Thorndike C. T. New, and assigned to the same assignee as the subject application, there is described a novel form of solid state controllable rectifier device having both turn-on and turn-off characteristics whereby current flow out of the control electrode to the cathode electrode will turn-off the conductivity of the rectifier and current flow into the control from the cathode electrode will turn-on the conductivity of the rectifier. In the co-pending patent application, S.N. 260,159, filed Feb. 21, 1963, in the name of Alec H. B. Walker, and assigned to the same assignee as the subject application, there is described a novel and simplified form of self-excited chopper circuit capable of chopping large amounts of power over widely adjustable ranges of frequency and duty cycle to thereby control the amount of power in a load circuit with the use of one or more solid state controllable rectifier devices of the type described in the aforementioned Patent No. 3,210,563.

It is a principal object of the present invention to provide an improved and simplified chopper type of power amplifier employing a self-excited chopper circuit with solid state controllable rectifier devices capable of providing large amounts of power amplification with a minimum physical size of components and a maximum of efficiency.

In accordance with the invention, the power amplifier may be comprised of at least one self-excited chopper circuit employing one or more solid state controllable rectifier devices having both turn-on and turn-off characteristics together with means for coupling a signal to be amplified in series with the bias source in the self-exciting chopper circuit and means to couple variations in average chopper current resulting from the controlled chopper current flow through the rectifier devices to suitable output utilization means. The arrangement is such that the amplitude variations of low power input signals in series with the bias source which may, for example, be in the audio frequency range, are effective to change either or both the frequency and duty cycle of the chopped current through the self-excited chopper circuit to thereby cause changes, in the audio frequency range, of the average current flow through the rectifier devices thereby effecting power amplification of the input signals.

Figure 2:
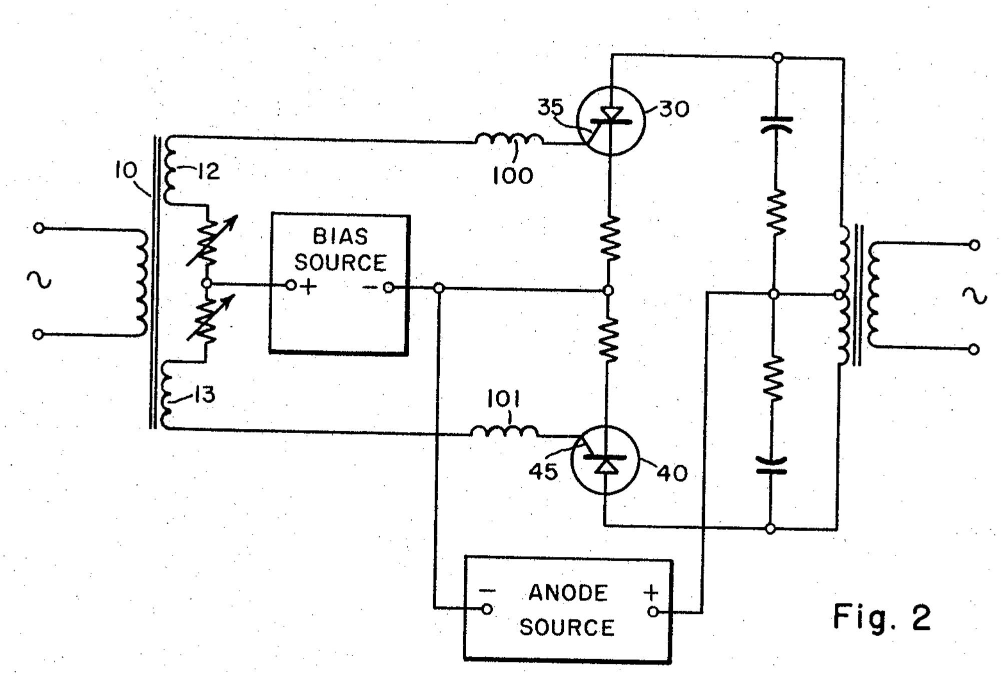

Further objects, features and the attending advantages of the invention will be apparent with reference to the following specification and drawing in which:

FIGURE 1 is a schematic wiring diagram of the circuit of one form of chopper amplifier of the invention; and FIGURE 2 is a schematic wiring diagram of another embodiment of chopper amplifier of the invention.

Referring to the drawing, although both forms of the invention as will be described in detail in connection with either FIGURE 1 or FIGURE 2 of the drawing are push-pull amplifiers it should be understood that either of such arrangements may be readily converted to a single-ended amplifier by substituting single-ended input and output transformers for the push-pull input and output transformers as described and by utilizing a single controllable rectifier device instead of the two controllable rectifier devices as required for a push-pull circuit. It is believed that the conversion of the push-pull form of the invention to a single-ended form of the invention as mentioned above is obvious to one skilled in the art and need not be described in detail although it should be understood that the invention in its broadest concept is applicable to either single-ended or push-pull amplifiers.

Referring now to FIGURE 1 of the drawings, a push-pull input transformer 10 is provided with a primary winding 11 and a pair of secondary windings 12 and 13. The primary winding 11 is connected to input terminals 14 and 15 to which is connected the signal to be amplified which may be in the audio frequency range. Although two separate secondary windings 12 and 13 are shown for the input transformer 10, it should be understood that a single center tapped secondary winding may be substituted therefor in the event that a balancing of bias current through the secondary windings to the respective controllable rectifier device is not required as will be described in detail.

An output transformer 20 having a center tapped primary winding 21 and a secondary output winding 22 connected to output terminals 23 and 24 is also provided. The controllable rectifier device 30 which is a solid state device having both turn-on and turn-off characteristics as described in the aforementioned Patent No. 3,210,563 is provided with an anode electrode 31 connected to one terminal of the output winding 21 other than its center tap terminal 25, which terminal is connected to the positive terminal 26 of the direct current anode voltage source 27 (not shown in detail). The cathode electrode 32 of rectifier device 30 is connected through resistance 34 to the negative terminal 28 of the anode voltage source 27. The control electrode 35 of the controllable rectifier device 30 is connected to one terminal 16 of the secondary winding 12 of the input transformer 10 while the other terminal 17 of the secondary winding 12 is connected through an adjustable current balancing resistor device 50 to the positive terminal 51 of the direct current bias source 52 (not shown in detail). The negative terminal 53 of the bias source 52 is also connected to the negative terminal 28 of the anode source 27 and through the cathode resistance 34 to the cathode electrode 32 of the controllable rectifier device 30.

Similarly, the anode electrode 41 of the controllable device 40 which is substantially identical to the device 30 is connected to the other terminal of the primary winding 21 of the output transformer 20 and therethrough to the center tap terminal 25 and the positive terminal 26 of the anode source 27. Also the cathode electrode 42 is connected through the cathode resistance 44 to the negative terminal 28 of the anode source and the negative terminal 53 of the bias voltage source 52. Furthermore, the control electrode 45 is connected to the terminal 18 of the secondary winding 13 whose other terminal 19 is connected through the adjustable current balancing resistance device 55 to the positice terminal 51 of the bias source 52.

Thus, the anode-cathode circuit for the rectifier device 30 includes the resistance 34, the anode source 27 and the primary winding 21 of the output transformer 20, while the anode-cathode circuit for the rectifier device 40 includes the resistance 44, the anode source 27 and the primary winding 21 of the output transformer 20. Furthermore, the control-cathode circuit for rectifier device 30 includes the resistance 34, the secondary winding 12 of the primary transformer 10, the balancing resistor 50 and the bias source 52, while the control-cathode circuit for the rectifier device 40 includes the resistance 44 the bias source 52, the balancing resistance 53 and the secondary winding 13 of the input transformer 10.

As more particularly described in the co-pending application S.N. 260,159 the circuit arrangements for the rectifier devices 30 and 40 further also include a reactance such as the capacitor 60 in the control cathode circuit for the rectifier device 30 and the capacitor 80 in the control-cathode circuit for the rectifier device 40 to comprise a pair of self-excited chopper circuits for chopping or interrupting the flow of current through the respective rectifier device from its anode electrode to its cathode electrode at a predetermined chopping frequency and duty cycle as determined by the values of the respective resistors 34, 44 capacitors 60, 80 and bias source 52. Since the values of the bias source 52 and each of the capacitors 60, 80 and resistors 34, 44 are fixed, a predetermined chopping frequency and duty cycle for chopping current flowing through the primary winding 21 of the output transfomer 20 is obtained. However, by superimposing a variable R.M.S. signal voltage from terminals 14 and 15 through the input transformer 10 and secondary windings 12 and 13 onto the bias source 52, the chopping frequency and duty cycle of chopped current flowing through the primary winding 21 of the output transformer 20 is varied in accordance with the variations of the input signal applied across the input terminals 14 and 15, thereby producing an amplified signal output. The balancing resistance devices 50 and 55 may be adjusted in order that the chopping current flow through the respective rectifier devices 30 and 40 may be adjusted to be substantially equal for a given input signal.

In order to improve the efficiency and minimize distortion of the chopper power amplifier of FIGURE 1, as described, a filter circuit comprising capacitors 90 and 91 and resistors 92 and 93 may be provided as shown. Capacitor 90 is connected in series with resistance 92 and in parallel with one portion of the center tapped primary winding 21 of the output transformer 20 while capacitor 91 and resistor 93 are connected in series and in parallel with the other portion of the center tapped primary winding 21 of the output transformer 20. In practice, the values for the capacitors 90, 91 and resistors 92 and 93 are chosen to tune the primary winding of the output transformer 20 to effectively present a resistive load to the respective rectifier devices 30 and 40 at or within the chopping frequency range so as to minimize the effect of the chopping frequency of the chopper currents on the primary winding 21 of the output transformer 20.

The following values may be used for the amplifier circuit of FIGURE 1 as arranged to operate in what might be termed a typical Class B operation. The input transformer 10 was provided with a step-up ratio of approximately 1:5 and the impedances of the windings were not critical. The output transformer 20 was a standard type of push-pull output transformer which may typically have a secondary winding impedance of about 5,000 ohms. Each of the controllable rectifier devices 30 were devices of an experimental type identified by the number 240 and obtainable from the Westinghouse Manufacturing Plant at Youngwood, Pennsylvania. The bias voltage source 52 was provided with a maximum potential of 15 volts while the anode voltage source 27 was provided with a maximum potential of 100 volts. Each of the cathode resistors 34 and 44 had a resistance of 500 ohms while the associated reactance 60, 80 in the respective control cathode circuits for the devices 30, 40 had a capacitance value of .1 mfd. The value for each of the adjusting balancing resistors 50 and 55 is relatively non-critical and may be within the range of 10 to 50 ohms respectively. With the values chosen as mentioned above, the chopping frequency averaged about 100 kc. with an 80% duty cycle and was effective to provide power amplification for an input signal varying within the audio frequency range of about 2 volts R.M.S. Each of the filter capacitors 90, 91 may have a value of approximately .5 mfd. while the filter resistors 92 and 93 may each have a resistance of approximately 500 ohms. The power obtainable with the circuit employing the values above is approximately 10 watts of output power. By varying the bias voltage for the bias source 52 and/or the size of the cathode resistors 34, 44 the range of power output may be varied accordingly and it has been found that the bias voltage may be as low as 1½ volts with each of the cathode resistors 34 and 44 having a resistance of 50 ohms instead of the 500 ohms previously mentioned when the bias voltage is 15 volts.

A modified form of the invention is shown by FIGURE 2 of the drawing wherein an inductive reactance in the control cathode circuit is employed in place of the capacitive reactance of the capacitors 60 and 80 to predetermine the chopping frequency and duty cycle of the amplifier. In the arrangement of FIGURE 2 inductive reactors 100 and 101 are connected in series with the respective control electrodes 35, 45 of the rectifier devices 30, 40 to the secondary windings 12 and 13 of the input transformer 10. The inductive reactances 100 and 101 function in a similar manner to the capacitive reactors 60, 80 of FIGURE 1 of the drawing which are therefore omitted in the circuit of FIGURE 2. Since the remainder of the power amplifier circuit is essentially the same as that of FIGURE 1 it will not be further described in detail, and it is believed that the operation of the chopper amplifier circuit is obvious when compared to the description of the operation of the circuit of FIGURE 1.

Various modifications may be made within the spirit of the invention. For example, as previously noted either of the amplifier circuits of FIGURES 1 or 2 may be readily modified to a single ended amplifier instead of the push-pull amplifier as described. Also, the provision of separate input windings and the employment of balancing resistors 50, 55 may be dispensed with if the uniformity of each of the rectifying devices 30 and 40 is sufficiently good to make it unnecessary to individually balance the chopping currents therethrough. Also various forms of filtering arrangements and feed-back arrangements may be provided to increase efficiency and reduce distortion as would be obvious to those skilled in the art.

I claim as my invention:

1. A chopper amplifier comprising, at least one controllable rectifier device each having anode, cathode and control electrodes with both turn-on and turn-off control characteristics, input terminals, output terminals, a source of anode voltage connected in series with said anode and cathode electrodes, a source of bias voltage connected in series with said control and cathode electrodes, a resistance connected in both the anode-cathode and control-cathode circuits, reactance means connected in the control-cathode circuit to delay both the flow of turn-off current generated by said resistance and the flow of turn-on current from said bias source and hence predetermine the chopping frequency and duty cycle of the conductive and non-conductive states of said device, means to couple a signal to be amplified from said input terminals in series with the bias source in the control-cathode circuit of said device, and means to couple the amplified output signal in said anode circuit to said output terminals.

2. A push-pull chopper amplifier comprising, a pair of controllable rectifier devices each having anode, cathode and control electrodes with both turn-on and turn-off control characteristics, input terminals, output terminals, a source of anode voltage connected in series with the anode and cathode electrodes of said devices, a source of bias voltage connected in series with the control and cathode electrodes of said devices, a resistance connected in both the anode-cathode and the control-cathode circuits of said devices, reactance means connected in the control-cathode circuits of each of said devices to delay both the flow of turn-off current generated by said resistance and the flow of turn-on current from said bias source and hence predetermine the chopping frequency and duty cycle of the conductive and non-conductive states of said devices, means to couple in push-pull relation a signal to be amplified from said input terminals in series with the bias source in the control-cathode circuits of each of said devices, and means to couple in push-pull relation the amplified output signals in the anode circuit of said devices to said output terminals.

3. A push-pull chopper power amplifier comprising, an input transformer having an input primary winding and a center-tapped secondary winding, an output transformer having a center-tapped primary winding and an output secondary winding, a pair of controllable rectifier devices with both turn-on and turn-off characteristics and having anode, cathode and control electrodes respectively, a source of direct current bias voltage, a source of direct current anode voltage, a common ground terminal, means connecting the positive terminal of said anode voltage source to the center tap of the output transformer and the negative terminal of said anode voltage source to said ground terminal, means connecting the negative terminal of said bias source to said ground terminal and the positive terminal of said bias source to the center tap of the secondary winding of said input transformer, means connecting one terminal other than the center tap of said secondary winding to the control electrode of one of said devices and another terminal other than the center tap of said secondary winding to the control electrode of the other of said devices, means connecting the anode electrode of one of said devices to a terminal other than the center tap of the primary winding of said output transformer and the anode of the other of said devices to another terminal other than the center top of the primary winding of said output transformer, resistance means connecting the cathodes of each of said devices to said ground terminal, and reactance means connected in the control-cathode electrode circuits of each of said devices to delay the build-up of turn-off current flow by said resistance means and to delay the build-up of turn-on current flow by said bias source to thereby predetermine the chopping frequency and duty cycle of the conductive and non-conductive states of said devices while amplifying the power of signals from said input transformer to said output transformer.

4. The invention of claim 3 in which filter means is connected in the anode circuits of each of said devices and tuned to provide with the inductance of said output transformer, a resistive load for the devices at the chopping frequency.

5. The invention of claim 3 in which said reactance is comprised of an inductance.

6. The invention of claim 3 in which said reactance is comprised of a capacitance.

7. The invention of claim 4 in which said reactance is comprised of an inductance.

8. The invention of claim 4 in which said reactance is comprised of a capacitance.

9. A push-pull chopper power amplifier comprising, an input transformer having an input primary winding and first and second secondary windings, an output transformer having a center-tapped primary winding and an output secondary winding, a pair of controllable rectifier devices with both turn-on and turn-off characteristics and having anode, cathode and control electrodes respectively, a source of direct current bias voltage, a source of direct current anode voltage, a common ground terminal, means connecting the positive terminal of said anode voltage source to the center tap of the output transformer and the negative terminal of said anode voltage source to said ground terminal, means connecting the negative terminal of said bias source to said ground terminal, means connecting the negative terminal of said bias source to said ground terminal and the positive terminal of said bias source to one terminal of each of the secondary windings of said input transformer, means connecting the other terminal of one of said secondary windings to the control electrode of one of said devices and other terminal of the other of said secondary windings to the control electrode of the other of one of said devices, means connecting the anode of one of said devices to a terminal other than the center tap of the primary winding of said output transformer and the anode of the other of said devices to another terminal other than the center tap of the primary winding of said output transformer, resistance means connecting the cathodes of each of said devices to said ground terminal, and reactance means connected in the control-cathode electrode circuits of each of said devices to delay to delay the build-up of turn-off current flow by said resistance means and to delay the build up of turn-on current flow by said bias source to thereby predetermine the chopping frequency and duty cycle of the conductive and non-conductive states of said devices while amplifying the power of signals from said input transformer to said output transformer.

10. The invention of claim 9 in which filter means is connected in the anode circuits of each of said devices and tuned to provide with the inductance of said output transformer a resistance load for the devices at the chopping frequency.

11. The invention of claim 10 in which said reactance is comprised of an inductance.

12. The invention of claim 10 in which said reactance is comprised of a capacitance.

13. A push-pull chopper power amplifier comprising, an input transformer having an input primary winding and first and second secondary windings, an output transformer having a center-tapped primary winding and an output secondary winding, a pair of controllable rectifier devices with both turn-on and turn-off characteristics and having anode, cathode and control electrodes respectively, a source of direct current bias voltage, a source of direct current anode voltage, a common ground terminal, means connecting the positive terminal of said anode voltage source to the center tap of the output transformer and the negative terminal of said anode voltage source to said ground terminal, means connecting the negative terminal of said bias source to said ground terminal, means connecting the positive terminal of said bias source to one terminal of each of the secondary windings of said input transformer respectively through an adjustable resistor, means connecting the other terminal of one of said secondary windings to the control electrode of one of said devices and other terminal of the other of said secondary windings to the control electrode of the other of said devices, means connecting the anode electrode of one of said devices to a terminal other than the center tap of the primary winding of said output transformer and the anode of the other of said devices to another terminal other than the center tap of the primary winding of said output transformer, resistance means connecting the cathodes of each of said devices to said ground terminal, and reactance means connected in the control-cathode electrode circuits of each of said devices to delay the build-up of turn-off current flow by said resistance means and to delay the build-up of turn-on current flow by said bias source to thereby predetermine the chopping frequency and duty cycle of the conductive and non-conductive states of said devices while amplifying the power of signals from said input transformer to said output transformer.

14. The invention of claim 13 in which filter means is connected in the anode circuits of each of said devices and tuned to provide with the inductance of said output transformer a resistive load for the devices at chopping frequency.

15. The invention of claim 13 in which said reactance is comprised of an inductance.

16. The invention of claim 13 in which said reactance is comprised of a capacitance.

References Cited by the Examiner

UNITED STATES PATENTS

| | | | |
|---|---|---|---|
| 3,085,190 | 4/1963 | Kearns et al. | 307—88.5 |
| 3,089,965 | 5/1963 | Krezek | 307—88.5 |
| 3,176,150 | 3/1965 | McMurray | 307—88.5 |
| 3,229,226 | 1/1966 | Witting | 331—113 |
| 3,237,124 | 2/1966 | Wellford | 331—113 |

ARTHUR GAUSS, *Primary Examiner.*

J. JORDAN, *Assistant Examiner.*